United States Patent
Ge et al.

(10) Patent No.: US 10,224,935 B2
(45) Date of Patent: Mar. 5, 2019

(54) RATIOED LOGIC WITH A HIGH IMPEDANCE LOAD

(71) Applicant: HEWLETT-PACKARD DEVELOPMENT COMPANY, L.P., Houston, TX (US)

(72) Inventors: Ning Ge, Palo Alto, CA (US); Boon Bing Ng, Singapore (SG); Leong Yap Chia, Singapore (SG)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 12 days.

(21) Appl. No.: 15/520,698

(22) PCT Filed: Oct. 30, 2014

(86) PCT No.: PCT/US2014/063160
§ 371 (c)(1),
(2) Date: Apr. 20, 2017

(87) PCT Pub. No.: WO2016/068938
PCT Pub. Date: May 6, 2016

(65) Prior Publication Data
US 2017/0317680 A1    Nov. 2, 2017

(51) Int. Cl.
*H03K 19/18*    (2006.01)
*H03K 19/173*    (2006.01)
(Continued)

(52) U.S. Cl.
CPC ............ *H03K 19/18* (2013.01); *H03K 3/45* (2013.01); *H03K 19/0944* (2013.01); *H03K 19/173* (2013.01); *G11C 13/0002* (2013.01)

(58) Field of Classification Search
CPC .......... H03K 19/0963; H03K 19/0944; H03K 19/18; H03K 19/173
(Continued)

(56) References Cited

U.S. PATENT DOCUMENTS 5,654,860 A * 8/1997 Casper ................ H01L 27/0266
                                                    361/111
6,025,736 A * 2/2000 Vora .................... H03K 17/6257
                                                    326/39
(Continued)

FOREIGN PATENT DOCUMENTS

CN    102891678 A    1/2013
EP    1760889 A2    3/2007

OTHER PUBLICATIONS

Abdoli, B. et al., A Novel CMOS-Memristor Based Inverter Circuit Design [online], Retrieved from the Internet <http://www.academia.edu/7185468/A_Novel_CMOS-Memristor_Based_Inverter_Circuit_Design> [retrieved on Jul. 28, 2014].
(Continued)

*Primary Examiner* — Tung X Le
(74) *Attorney, Agent, or Firm* — HP Inc. Patent Department

(57) ABSTRACT

A device having ratioed logic with a high impedance load is described. The device includes a pull-down network coupled between a first voltage and an output. The device also includes a high impedance load coupled between a second voltage and the output. The high impedance load being smaller than a transistor of the pull-down network.

19 Claims, 8 Drawing Sheets

(51) Int. Cl.
*H03K 3/45* (2006.01)
*H03K 19/0944* (2006.01)
*G11C 13/00* (2006.01)

(58) Field of Classification Search
USPC ................................. 326/81, 83, 87, 104
See application file for complete search history.

(56) References Cited

U.S. PATENT DOCUMENTS

| | | | | |
|---|---|---|---|---|
| 6,043,681 | A * | 3/2000 | Lim | H03K 19/00315 |
| | | | | 326/81 |
| 7,157,931 | B2 * | 1/2007 | Song | H04L 25/0298 |
| | | | | 326/30 |
| 7,511,534 | B1 * | 3/2009 | Bringivijayaraghavan | |
| | | | | H03K 19/0005 |
| | | | | 326/83 |
| 7,764,082 | B2 * | 7/2010 | Yan | H04L 25/0298 |
| | | | | 326/30 |
| 8,773,167 | B2 * | 7/2014 | Robinett | G11C 13/0007 |
| | | | | 326/104 |
| 2006/0001452 | A1 | 1/2006 | Wijeratne et al. | |
| 2006/0017457 | A1 * | 1/2006 | Pan | H03K 19/00384 |
| | | | | 326/32 |
| 2010/0007373 | A1 | 1/2010 | Wong | |
| 2011/0043246 | A1 | 2/2011 | Millar | |
| 2012/0212255 | A1 * | 8/2012 | Jeong | G11C 11/5678 |
| | | | | 326/38 |
| 2014/0028347 | A1 | 1/2014 | Robinett et al. | |
| 2014/0029328 | A1 | 1/2014 | Ribeiro | |
| 2017/0141302 | A1 * | 5/2017 | Bessonov | H01L 45/08 |

OTHER PUBLICATIONS

Abid, Z. et al., Memristors-based NMOS Logic Circuits [online], Dec. 16-20, 2012, 2012 24th International Conference on Microelectronics (ICM), Retrieved from the Internet <http://ieeexplore.ieee.org/xpl/login.jsp?tp=&arnumber=6471402&url=http%3A%2F%2Fieeexplore.ieee.org%2Fstamp%2Fstamp.jsp%3Farnumber%3D6471402> [retrieved on Jul. 28, 2014].

Nanoti, N.G. et al., Design of High Speed Addressable Memory Based on Memory-resistance Using 45nm CMOS Technology, International Journal of Application or Innovation in Engineering & Management, vol. 3, Issue 3, Mar. 2014, pp. 467-477.

* cited by examiner

RATIOED LOGIC WITH A HIGH IMPEDANCE LOAD

BACKGROUND

CMOS is a logic architecture that uses both PMOS and NMOS transistors to generate an output. The PMOS transistor and the NMOS transistor are connected in series. When the logic is not being changed, either the PMOS or the NMOS is open. As a result, when the logic is static, there is an open element in line which prevents the flow of current. During the transition between states, neither the PMOS nor the NMOS is open, so current flows and consumes power. When the logic changes state, for instance, goes from 0 to 1, both the PMOS and the NMOS change state in opposite directions, to assure that there is one open and one close element in series. In other words, if the PMOS changes from open to closed, the NMOS simultaneously changes from closed to open.

BRIEF DESCRIPTION OF THE DRAWINGS

The accompanying drawings illustrate various examples of the principles described herein and are a part of the specification. The illustrated examples do not limit the scope of the claims.

Throughout the drawings, identical reference numbers designate similar, but not necessarily identical, elements.

DETAILED DESCRIPTION

Figure 1:
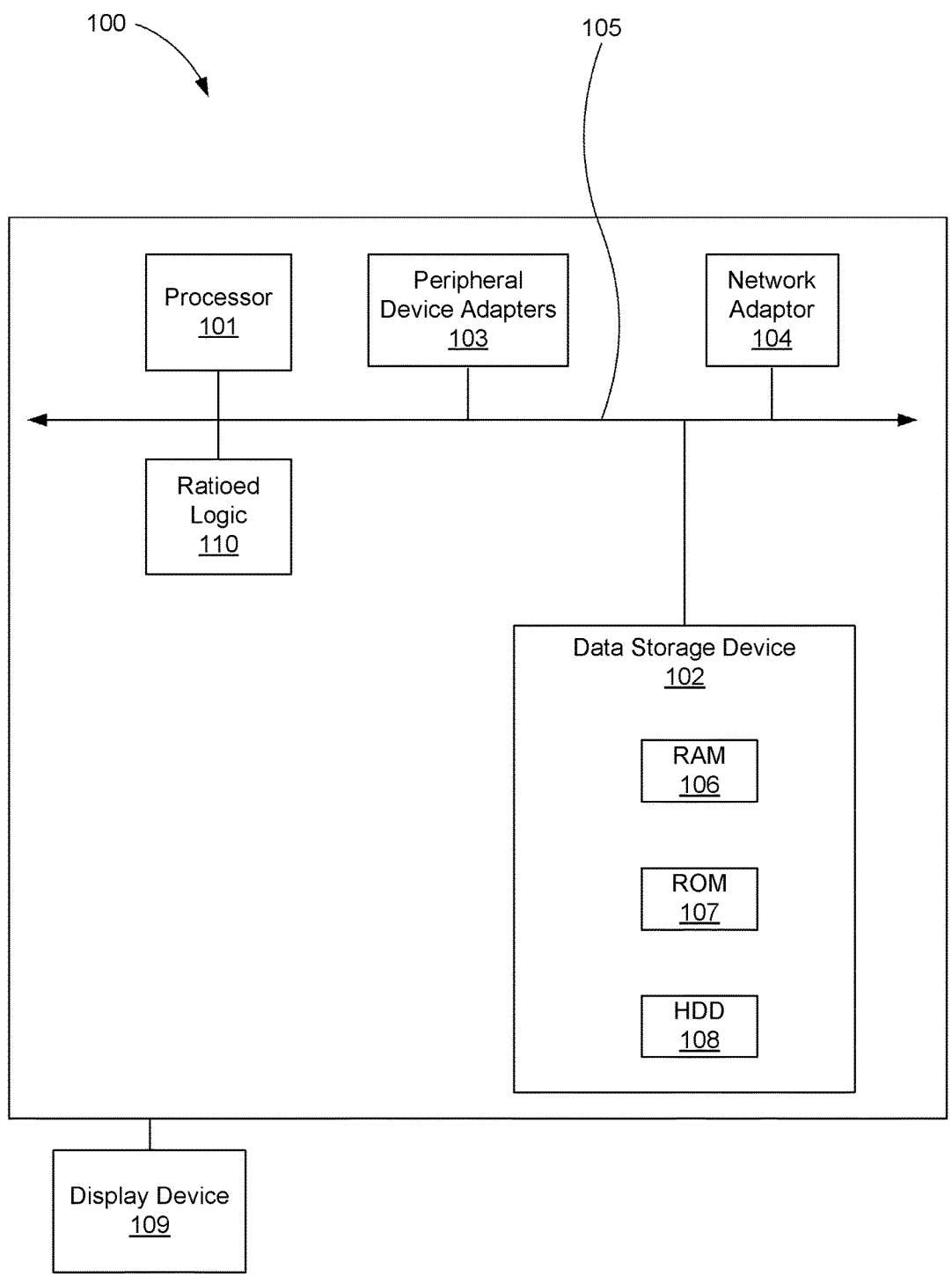
FIG. 1 is a diagram of a computing system, according to one example of the principles described herein.

CMOS circuits implement both PMOS circuits and NMOS circuits to generate a logic value output. For example, an NMOS circuit may be coupled to a first supply voltage and an output. When the NMOS circuit is closed, the output is a first voltage supplied by the first voltage and a logic value associated with the first voltage is output. Similarly, a PMOS circuit may be coupled to a second voltage and the output. When the PMOS circuit is closed, the output is a second voltage supplied by the second voltage and a logic value associated with the second voltage is output. Because CMOS uses both NMOS circuits and PMOS circuits, CMOS circuitry may have reduced power consumption. For example, in a CMOS circuit, each PMOS circuit is in series with an NMOS circuit such that when one is open the other is closed, preventing current flow. It is when the PMOS and NMOS circuits are changing states that significant current flows through the CMOS. Because of the reduced power consumption of CMOS circuits and the attendant reduction in heating, CMOS architecture has seen widespread use in electronics. However, while CMOS circuits may be beneficial, some characteristics may prevent their expanded use.

For example, CMOS circuits, by incorporating both NMOS circuits and PMOS circuits, may have a greater quantity, and more complicated, operations to fabricate and accordingly may be more expensive. Accordingly, a ratioed network may be used instead of CMOS. In a ratioed network, another component replaces one of the NMOS or PMOS components of the CMOS network.

For example, a ratioed NMOS includes a pull-down network including a number of NMOS transistors to couple the output to a first voltage that may be associated with one logic value. The ratioed NMOS also includes another load that connects the output to the second voltage that may be associated with a second logic value. Ratioed NMOS networks offer manufacturing advantages over CMOS due to the reduced number of manufacturing operations during wafer fabrication. Moreover, ratioed NMOS systems may also utilize smaller logic elements. While ratioed logic circuits may be beneficial, they may have some restrains on expanded use. For example, the other load of the ratioed NMOS circuit may take up significant space on the circuit due in part to the large resistance used for a pseudo-pull up network.

Accordingly, the present specification describes devices and methods to alleviate these and other complications. More specifically, the present specification describes a ratioed logic that includes a high impedance load that is much smaller than other high impedance loads. The high impedance load may be a memristor. The memristor is a two connection electronic component whose resistance is dependent upon its current history. A memristor may be used as a memory element to store a logic value based on a resistance of the memristor. A memristor is non-volatile, meaning that data in the resistance state is retained even when power is not applied to the memristor. As will be described below, memristors have a metal-insulator-metal structure that occupies a relatively small amount of surface area on a chip, making them attractive as a potential memory for electronics applications. In some examples, memristors can be 4F2 in size. Still further, memristors can be manufactured and implemented relatively cheaply, thereby reducing the cost associated with production. Memristors may be added to a wafer with few or no additional manufacturing operations.

Memristors can be made in a number of geometries and using a variety of materials. One form is a metal-insulator-metal memristor. The term metal is meant to refer broadly to indicate a conductor, for instance doped silicon. A memristor may include a bottom electrode (metal), a switching oxide (insulator), and a top electrode (metal). The bottom electrode, which may be part of another electronic component, is coated with an insulator to form a switching oxide. This switching oxide insulator is then coated with a layer of another conductive material to form a top electrode.

In this manner, the application of an electrical field can shift a memristor from high resistance to low resistance (or vice versa). Absent an applied field, the holes are stable and thus the resistance state of the memristor can be used to store data without a continuous supply of power. The memristor can be used to provide high impedance values in the high resistant state. The thickness, composition, and structure of the insulating switching oxide can be controlled during deposition to generate a desired resistance.

The present specification describes a device having ratioed logic with a high impedance load. The device includes an output and a pull-down network serially-coupled between a first voltage and the output. The device also includes a high impedance load serially-coupled between a second voltage and the output. The high impedance load is smaller than a transistor in the pull-down network.

The present specification describes a system having ratioed logic with a high impedance load. The system includes a first voltage, a second voltage, and an output. The system also includes a number of n-channel metal-oxide-semiconductor field effect transistors (NMOSs) serially-coupled between the first voltage and the output and a high impedance load serially-coupled between the second voltage and the output. The high impedance load being disposed on the drain of an NMOS.

The present specification also describes a method for forming ratioed logic with a high impedance load. The method includes forming a first metal-oxide-semiconductor field-effect transistor (MOSFET) on a substrate and forming a second MOSFET on the substrate. The method further includes forming a high impedance load on top of a drain of the second MOSFET. A source of the second MOSFET and a drain of the first MOSFET are shared. The drain of the first MOSFET is encompassed by the source of the first MOSFET. The drain of the second MOSFET is encompassed by the source of the second MOSFET.

As used in the present specification and in the appended claims, the term "memristor" may refer to a passive two-terminal circuit element that maintains a functional relationship between the time integral of current, and the time integral of voltage.

As used in the present specification and in the appended claims, the terms "AND", "OR", "NAND", "XOR", "NOT", etc. when presented in all caps refer to the corresponding logic operation and not the ordinary English usage.

Still further, as used in the present specification and in the appended claims, the term "a number of" or similar language may include any positive number from 1 to infinity.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Turning now to the figures, FIG. 1 is a diagram of a computing system (100), according to one example of the principles described herein. The computing system (100) may be implemented in an electronic device. Examples of electronic devices include servers, desktop computers, laptop computers, personal digital assistants (PDAs), printers, printheads, mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The functionality of the computing system (100) is in accordance to the methods of the present specification described herein. In the course of executing code, the processor (101) may receive input from and provide output to a number of the remaining hardware units. The data storage device (102) may store data such as executable program code that is executed by the processor (101) or other processing device. The data storage device (102) may include information for converting or transferring signals between the ratioed logic (110) and other components.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106). In other examples, the ratioed logic (110) also processes data stored in the data storage device (102) according to computer instructions stored in the data storage device (102).

The data storage device (102) may include a computer readable medium, a computer readable storage medium, or a non-transitory computer readable medium, among others. For example, the data storage device (102) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). Examples of display devices (109) include a computer screen, a laptop screen, a mobile device screen, a personal digital assistant (PDA) screen, and a tablet screen, among other display devices (106).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product including a number of the modules.

The computing system (100) further includes ratioed logic (110). The ratioed logic may perform some or all of the functions of the processor (101), data storage device (102), hardware adaptors (103), or other components. The ratioed logic (110) includes a plurality of transistors organized to perform logic, data storage, and data processing. In some examples, the ratioed logic (110) includes a processor or application specific integrated circuit (ASIC). In another example, the ratioed logic (110) may serve as short term memory, a graphics engine, a processor, or similar role in a general purpose machine. The ratioed logic (110) may be located on a single chip or may be a collection of devices in communication. The signals provided to the ratioed logic (110) may come from the processor (101), the data storage device (102), peripheral device adapters (103), the network (104), or combinations thereof. In some designs, these signals are provided through the bus (105) while in other designs the signals are provided by direct connections. Similarly, the ratioed logic (110) may output signals to a variety of sources, including the processor (101), the data storage device (102), the peripheral adaptors (103), the network adaptor (104), the display devices (109), or combinations thereof. In some examples the ratioed logic (110) functions as a specialty processor for the computing device.

In some examples, the ratioed logic (110) performs the functionality of the processor (101), while in other examples the ratioed logic (110) functions as a specialty processor or adjunct processor. The ratioed logic (110) may provide dedicated calculation support to facilitate parallel processing, graphics, or math calculation. In other examples, the ratioed logic (110) includes dedicated elements for print file generation or conversion. The ratioed logic (110) may serve as a device on a chip, incorporating data storage devices (102) and processor (101). Computer readable instructions for the ratioed logic (110) may be stored in the data storage device (102), including specialized instructions for use with the electronics elements and response of the ratioed logic (110). The design and components of the ratioed logic (110) are further described below.

Figure 2:
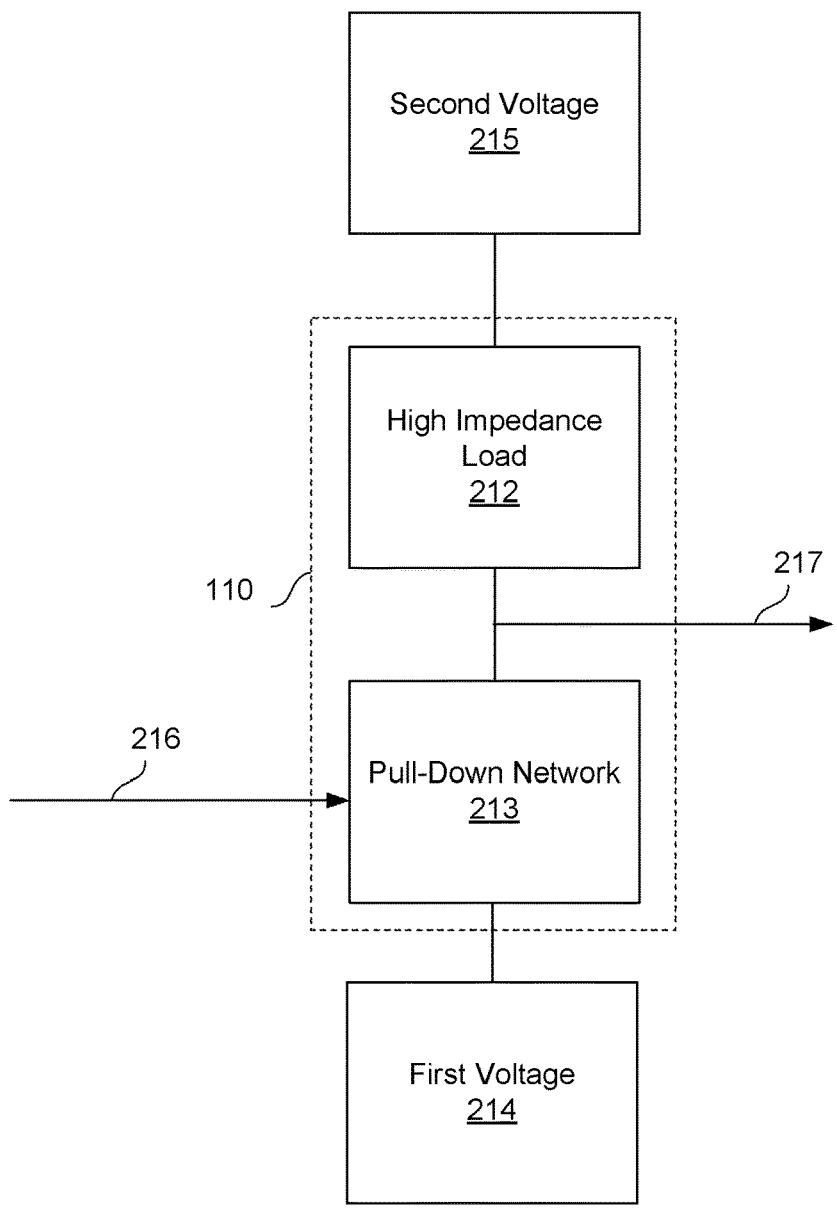
FIG. 2 is a block diagram of ratioed logic with a high impedance load according to one example of the principles described herein.

FIG. 2 is a block diagram of ratioed logic (110) with a high impedance load (212) according to one example of the principles described herein. The ratioed logic (110) may refer to circuitry that connects an output (217) to either a first voltage (214), which may be ground, negative, or less than a second voltage (215), which second voltage (215) may be positive. More specifically, the ratioed logic (110) implements pull up devices and pull down devices of different strengths to pass either a high or low output (217). The ratioed logic (110) may be included on any device that relies on circuitry to carry out operations. For example, the ratioed logic (110) may be included on a desktop computer, laptop computer, printer, application specific integrated circuit (ASIC), personal computing device or any other type of electronic device. The ratioed logic (110) may also be included on any type of element that is used in performing logic functions. For example, the ratioed logic (110) may be included on a memory chip or a printhead among other integrated circuits. The ratioed logic (110) may perform some or all of the functions of the processor (FIG. 1, 101), the data storage device (FIG. 1, 102), the peripheral device adaptors (FIG. 1, 103), the network adaptor (FIG. 1, 104), bus (FIG. 1, 105), and/or the display (FIG. 1, 109).

In general, the ratioed logic (110) generates an output (217). The output (217) will reflect one of two voltages (214, 215) either the first voltage (214) or the second voltage (215). One of these voltages (214, 215) is used to represent and transmit a logical 1 and the other a logical 0. The pull down network (213) may be a collection of logical elements. The pull down network (213) receives input from control signals (216) which determine the state of the pull down network (213). Depending on the logical elements making up the pull down network (213) and the control signals (216) provided, the pull down network (213) will be in either an open or a closed state. When the pull down network (213) is open, there is no electrical connection between the output (217) and the first voltage (214), so the voltage on the output (217) will reflect the second voltage (215). When the pull down network (213) is closed, an electrical connection is established between the first voltage (214) and the output (217). Because the high impedance load (212) limits the flow of current from the second voltage (215), while no similar limit exists between the first voltage (214) and the output (217), the output (217) will reflect the first voltage (214). Accordingly, depending on the state of the pull-down network (213) the output will reflect either the first voltage (214) or the second voltage (215). The pull down network (213) may be open or closed but the high impedance load (212) is closed.

Accordingly, the first voltage (214) and the second voltage (215) provide the two states, 0 and 1, that are available as outputs (106). In some examples, the first voltage (214) is a ground, negative, or positive but of a lower voltage than the second voltage (215).

The pull-down network (213) can take a variety of forms. In one example, it is a number of NMOSs. The NMOSs may be connected so as to perform a variety of logic operations on the control signals (216). The pull-down network (213) may contain other electronic components besides NMOSs to facilitate these operations.

As described above, the ratioed logic (110) includes a high impedance load (212). The high impedance load (212) allows the output (217) to be generated based on the second voltage (215) which may be a positive voltage that is greater than the first voltage (214). The high impedance load (212) reduces the total current consumed by reducing flow between the first voltage (214) and second voltage (215). The high impedance load (212) also allows the output (217) to reflect either voltage (214, 215) using a single switch. Without the high impedance load (212), the load from the pull down network (213) would prevent the output (217) from reading the first voltage (214). The ratioed logic (110) as described herein may provide reduced amounts of current from the second voltage (215) to the output (217) due to the high impedance load (212) being connected in series with the pull-down network (213). However, if a larger current is needed from the second voltage (215), the output (217) can be used to control a transistor directly connected to the second voltage (215). Alternately, in an example where each transistor or group of transistors has a high impedance load (212), the resistance of the high impedance loads (212) can be varied to control the fan-out and to optimize the response time of the controlled logic.

In some examples, the high impedance load (212) is a memristor in a high resistance state. In other examples, the high impedance load (212) is a plurality of memristors, where some are in a high resistance state. The memristor may be non-rewriteable. This allows the memristor to be included independent of switching controls for the memristor, which further simplifies the device. This is advantageous in that the memristor cannot be set to the wrong value and cannot be accidently changed to the wrong value. The memristor state may be set during manufacturing or may be set later.

In one example, the high impedance load (212) is formed by placing a layer of insulating material, such as titanium dioxide, between two electrical contacts. Other examples of materials that can be used include silicon nitride, silicon oxide, metal oxides including the oxides of refractory metals, or other materials. In some examples, other materials may be used to form multiple layers of the high impedance load (212). The high impedance load (212) may be made using non-silicon materials. The high impedance load (212) may include the oxide of a refractory metal. Without the high impedance load (212), there would be a large power drain across the circuit. To reduce the power consumption, a high impedance load (212) is introduced between the second voltage (215) and the pull-down network (213). The in-line high impedance load (212) limits the current flow and thus reduces power consumption.

FIGS. 3A-3C are circuit diagrams of ratioed logic (FIG. 1, 110) with a memristor (316) load according to examples of the principles described herein. Specifically, FIG. 3A depicts a ratioed logic (FIG. 1, 110) to perform an "AND" function. As depicted in FIG. 3A, the high impedance load (FIG. 2, 212) may be a memristor (316-1). As described above, the memristor (316-1) is a memory element that indicates a logic value based on a resistance level of the memristor (316). In some examples, a high resistance level is associated with a logic value 1 and a low resistance level with 0, the reverse may also be used, i.e. high represents 0 and low represents 1.

According to FIG. 3A, the second voltage (215-1) provides a voltage to the memristor (316-1) which in turn provides the voltage to the output (217-1). The memristor (316-1) prevents a large current flow from the second voltage (215-1) when one or both of the transistors of the pull-down network (FIG. 2, 213) are open. As depicted in FIG. 2A, when a first input (319-1) closes its transistor, the first voltage (214-1) can access the second transistor but cannot reach the output (217-1). When both the first and second inputs (319-1, 319-2) close their respective transistors, current can flow between the first voltage (214-1) and the output (217-1). Current continues to flow from the second voltage (215-1) through the memristor (316-1) to the output (217-1), but because the current from the second voltage (215-1) is reduced by the memristor (316-1); the output (217-1) changes state and reflects the first voltage (214-1). Because the output (217-1) reflects the first voltage (214-1) when both transistors are closed, this figure demonstrates the AND logic function.

FIG. 3B depicts a ratioed logic (FIG. 1, 110) implementing an AND as well as an OR function. Implementing both an AND and an OR function relies on three inputs (319-3, 319-4, 319-5) which may be indicated as a third input (319-3), a fourth input (319-4), and a fifth input (319-5) to distinguish between the first input (319-1) and the second input (319-2) described in FIG. 3A. In FIG. 3B, the second voltage (215-2), provides a positive voltage to the memristor (316-2). The memristor (316-2) prevents a large current flow from the second voltage (215-2) to the output (217-2). When both the transistors controlled by the fourth and fifth inputs (319-4, 319-5) are open, no current flows between the first voltage (214-2) and the transistor controlled by third input (319-3). However, if either or both of the fourth input (319-4) and the fifth input (319-5) closes its respective transistor, then current is available to reach the transistor controlled by third input (319-3). Thus, the fourth and fifth inputs (319-4, 319-5) form a logical OR relationship, as they are in parallel. Similar to FIG. 3A, the third input (319-3) forms a logical AND relationship with the pair of inputs (319-4) and (319-5). Accordingly this demonstrates both the OR and AND logic functions, with the output (217-2) representing the third input (319-3) AND (the fourth input (319-4) OR the fifth input (319-5)).

FIG. 3C depicts a ratioed logic (FIG. 1, 110) implementing a NOT function. Implementing a NOT function relies on a single input (319-6) which may be indicated as a sixth input (319-6) to distinguish between the inputs (319)

described in FIGS. 3A and 3B. The second voltage (215-3) provides a positive voltage to the memristor (316-3). The memristor (316-3) prevents large current flow from the second voltage (215-3) to the output (217-3). When the sixth input (319-6) closes its transistor, current can flow from the first voltage (214-3) to the output (217-3). This causes the output (217-3) to shift from the second voltage (215-3) to the first voltage (214-3). Accordingly, this circuit models the logic expression NOT. Together, FIGS. 3A-3C show the basic elements of a logic system; AND, OR, and NOT, that can be used to construct a complete logic.

Figure 4:
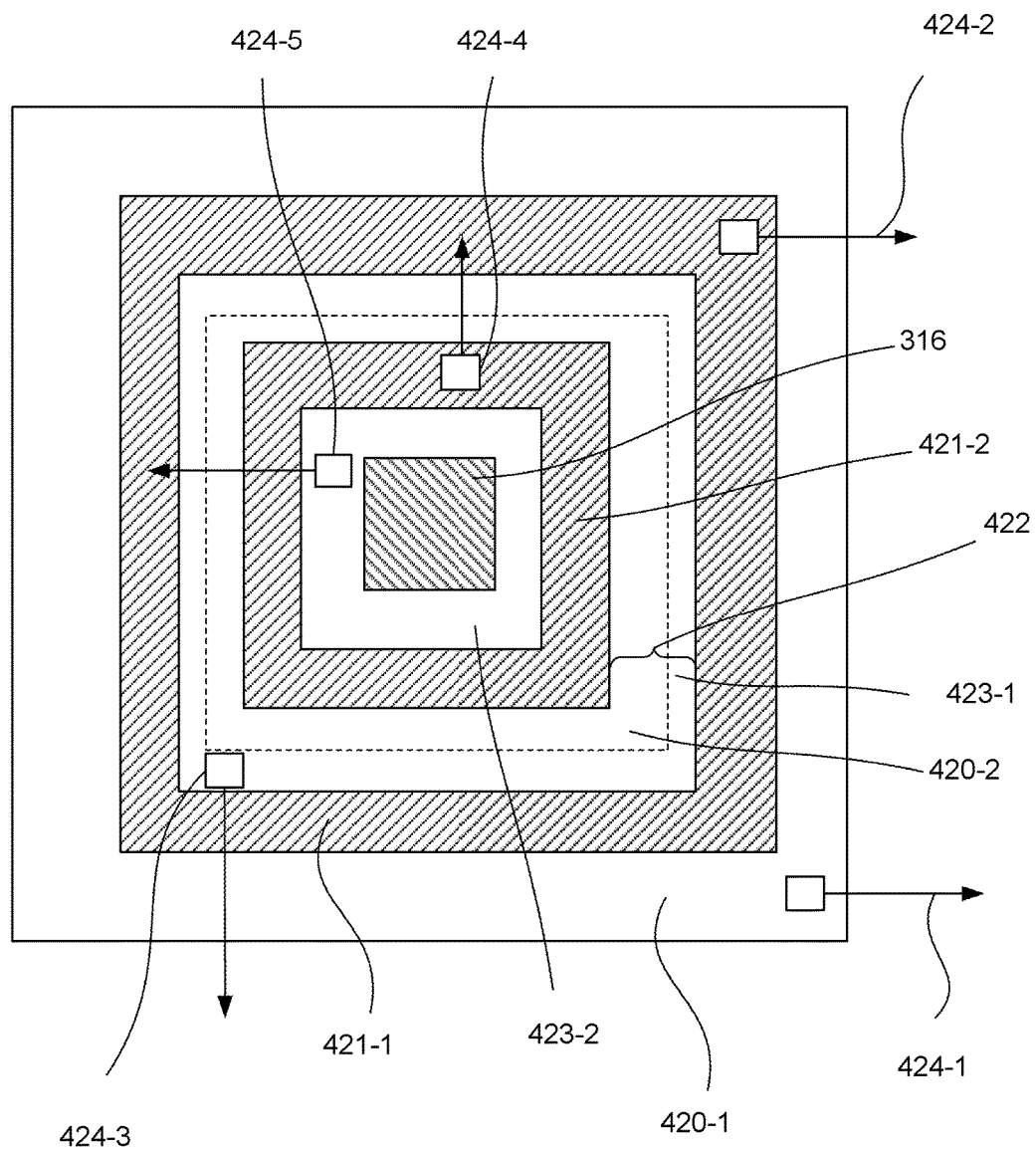
FIG. 4 is a top view of a multiple enclosure ratioed logic with a high impedance load according to one example of the principles described herein.

FIG. 4 is a diagram of a multiple enclosure ratioed logic (FIG. 1, 110) with a high impedance load (FIG. 2, 212) according to one example of the principles described herein. As described above, the high impedance load (FIG. 2, 212) may be a memristor (316). In some examples, the memristor (316) may be disposed on one of the transistors that make up the pull-down network (FIG. 2, 213). For example, the pull-down network (FIG. 2, 213) may include multiple transistors, each of which is an enclosed transistor. In another example, the pull-down network (FIG. 2, 213) may include a high impedance load (FIG. 2, 212) on the inside drain (423) of each group of enclosed transistors.

A transistor, for example, an outside transistor, may include a source (420-1), a gate (421-1), and a drain, which drain in FIG. 4 is a combined source/drain (422). As described above, in some examples, a combined source/drain (422) may act as a drain (423-1) of a first transistor and a source (420-2) of a second transistor. Accordingly, as used in the present specification, the reference number (422) indicates the combined source/drain and the reference number (420-2) indicates a source portion of the source/drain (422) and the reference number (423-1) indicates a drain portion of the source/drain (422). The dashed line in FIG. 4 is for illustrative purposes and does not indicate a physical distinction between the second source (420-2) and the first drain (423-1)

Electrical current flows between the drains (423-1, 423-2) and the sources (420-1, 420-2) based on an applied voltage at the gates (421-1, 421-2). For example, when no voltage is applied at the gates (421-1, 421-2), no current flows between the sources (420-1, 420-2) and the drains (423-1, 423-2). When voltage is applied to the first gate (421-1) using the routing element (424-2), current flows between the source (420-1) and the drain (423-1). In some examples, the sources (420) and the drains (423) may be formed of n-type semiconductors indicating that the sources (420) and drains (423) contain larger electron concentration than concentration of holes.

As depicted in FIG. 4, the multiple enclosure ratioed logic (FIG. 1, 110) may include a number of transistors having sources (420), gates (421), and drains (423), and a memristor (316) disposed on the drain (423-2) of at least one of the transistors. Specifically, the pull-down network (FIG. 2, 213) may include an outside transistor having a source (420-1), a gate (421-1), and a drain (423-1), the drain being part of the combined source/drain (422). The inside transistor also having a source (420-2) (as part of the combined source/drain (422)), a gate (421-2), and a drain (423-2). The high impedance load (FIG. 2, 212) may be a memristor (316) disposed on a drain (423-2) of the inside transistor of the pull-down network (FIG. 2, 213). This may be advantageous in providing a high impedance load (FIG. 2, 212) that does not occupy additional space. In this example, the high impedance load (FIG. 2, 212) is significantly smaller than a transistor.

More specifically, an outside transistor has a source (420-1). In some examples, the source (420-1) may be a continuous shape that surrounds the gate (421-1) of the outside transistor. The gate (421-1) may be a continuous shape that surrounds the drain (423-1) of the outside transistor. The drain (423-1) of the outside transistor may be a combined source/drain (422). The combined source/drain (422) also acts as the source (420-2) of the inside transistor. In some examples, the combined source/drain (422) may be a continuous shape that surrounds the gate (421-2) of the inside transistor. The gate (421-2) may be a continuous shape that surrounds the drain (423-2) of the inside transistor. While specific reference is made to two transistors making up a pull-down network (FIG. 2, 213), i.e., an outside transistor and an inside transistor, any number of transistors may be used to form the pull-down network (FIG. 2, 213). Routing elements (424-1, 424-3, 424-5) to the sources (420) and drains (423) of multiple transistors allow them to be combined to form AND, OR, NOT, and other logic functions. The first source (420-1), combined source/drain (422), and the second drain (423-2) may be disposed in a substrate, such as a p-type substrate that has a larger concentration of holes than electrons.

Each component within the transistors may be coupled to routing elements (424) that couple the components to other devices. For example, the source (420-1) of the outside transistor may be coupled to a first routing element (424-1) which is connected to the first voltage (FIG. 2, 214). In another example, the source (420-1) of the outside transistor is connected to the drain (423) of another transistor, to a memory element, or to some other signal source that is connected to the first voltage (FIG. 2, 214). Similarly, the gate (421-1) of the outside transistor is coupled by a routing element (424-2) to an input (FIG. 3, 319) that determines the state (open/closed) of the outside transistor. The combined source/drain (422) may be connected by a routing element (424-3) to provide or receive a signal. Signals like this may reduce the number of transistors used for some logic implementations. The gate (421-2) of the inside transistor may be coupled by a routing element (424-4) to an input (FIG. 3, 319) that determines the state of the inside transistor. The inside drain (423-2) may be coupled by a routing element (424-5) to the output (FIG. 2, 217).

Figure 5:
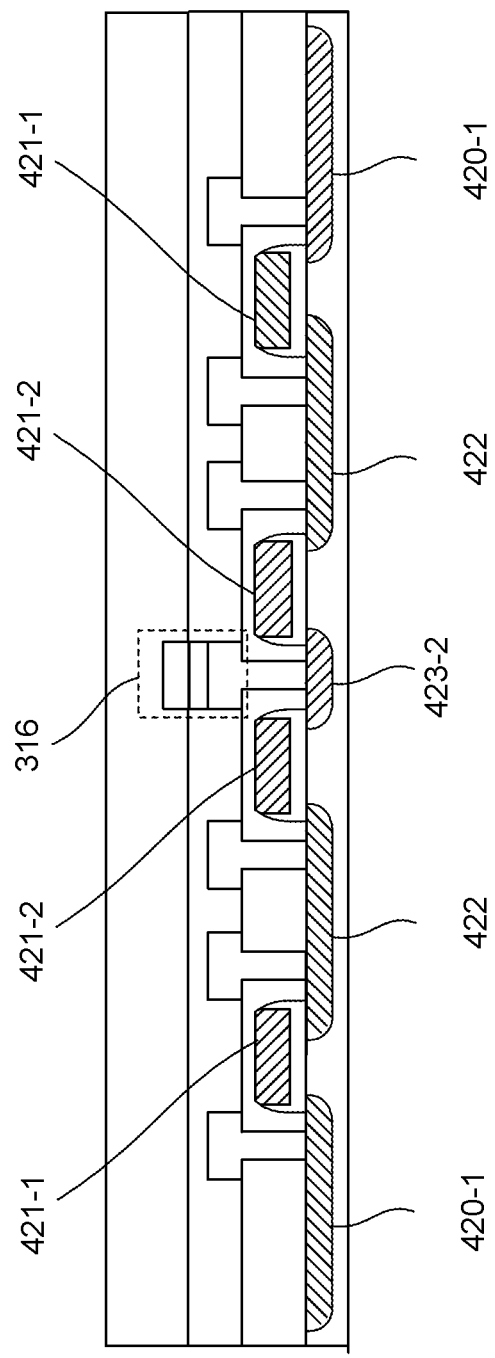
FIG. 5 is a cross-sectional view of a multiple enclosure ratioed logic with a high impedance load according to one example of the principles described herein.

As described above, a memristor (316) may be disposed on a drain (423) of at least one transistor. More specifically, as indicated in FIG. 5 as well, the bottom electrode of a memristor (316) may be disposed on a top surface of the drain (423-2) of the inside transistor. In some examples, the drain (423-2) of the inside transistor serves as an electrode of the memristor (316). A memristor (316) disposed on a drain (423) of a transistor may be beneficial by reducing the footprint of the memristor (316) on a circuit. Additionally as the memristor (316) bottom electrode is disposed directly on the drain (423), no routing element is used to join the memristor (316) to the transistor.

While the ratioed logic (FIG. 1, 110) in FIG. 4 is shown with two enclosed transistors any number of enclosed transistors may be implemented. Similarly, while the ratioed logic (FIG. 1, 110) and transistors in FIG. 4 are rectangular in shape, other shapes such as squares, rectangles, circles, ovals, trapezoids, triangles, polygons, and even irregular shapes may be used.

Constructing the ratioed logic (FIG. 1, 110) as described herein may have a number of benefits. For example, transistors coupled in series act as elements of an AND relationship. Transistors coupled in parallel act as elements of an OR relationship. Signal lines into the ratioed logic (FIG. 1, 110) are directed to gates (421). Results of the complete logic can be read from the inside drain (423) adjacent to the memristor (316).

Because AND is a commutative operation, it does not matter which input (319) is directed by the routing elements (424-2 and 424-4) to the inside gate (421-2) and which input (319) is directed to the outside gate (421-1). This allows additional design flexibility and minimizes the footprint used on the substrate.

A NOT operation can be generated using a single transistor with a single gate to invert a signal. This enclosure can be integrated with other enclosures or handled as a discrete element. This also provides design flexibility allowing additional logical operations, such as a NOT operation, while having a small footprint.

In some examples, the source of the outside transistor (420-1) will be coupled to the first voltage (FIG. 2, 214) received by the ratioed logic (FIG. 1, 110). In other examples, the source (420) will receive a signal provided by another logic element. Accordingly, designs with multiple enclosures can replicate complicated logics in small areas.

In some examples, because of the small size of the disclosed design for a high impedance load (FIG. 2, 212), it is possible to use a large number of individual high impedance loads (FIG. 2, 212), for instance providing one with each transistor. In other examples, it may be preferable to share a high impedance load (FIG. 2, 212) between a number of transistors or the entire pull down network (FIG. 2, 213). The high impedance load (FIG. 2, 212) may have different loads depending upon the response time desired for the relevant portions of the pull down network (FIG. 2, 213). Accordingly, some portions of the logic may be designed with faster response times and others with slower response times. This may be accomplished using the small sized high impedance loads (FIG. 1, 212) described. In FIG. 4, while a particular cross-hatching has been used to simplify distinction between a number of elements, such cross-hatching does not indicate particular material properties of those elements.

FIG. 5 shows a cross-sectional view of the multiple enclosure ratioed logic (FIG. 1, 110) according to one example of the principles described herein. As can be seen in FIG. 5, as well as previously illustrated in FIG. 4, at least one of the outside source (420-1), the outside gate (421-1), the combined source/drain (422), the inside gate (421-2) and the inside drain (423-2) may be enclosed elements that surround internal components. The outside source (420-1) may be connected to either the first voltage (FIG. 2, 214) or to a signal from another element, for instance the output of another logic element. The combined source/drain (422) allows the two transistors to be integrated and reduces the number of connections used. The inside drain (423-2) is connected to a high impedance load (FIG. 2, 212) such as a memristor (316), i.e., the bottom electrode of the memristor (316). The other side of the memristor (316), i.e., the top electrode, is connected to the second voltage (FIG. 2, 215). The sources (FIG. 4, 420-1, 420-2) and drains (FIG. 4, 423-1, 423-2) of the enclosed transistors are connected by at least one gate (421-1, 421-2). In some examples, these designs may be implemented with minimal modification to existing wafer fabrication equipment, allowing cost effective changeover and implementation. This may be the case with designs using memristors for memory elements or other functions. In FIG. 5, while a particular cross-hatching has been used to simplify distinction between a number of elements, such cross-hatching does not indicate particular material properties of those elements.

Figure 6:
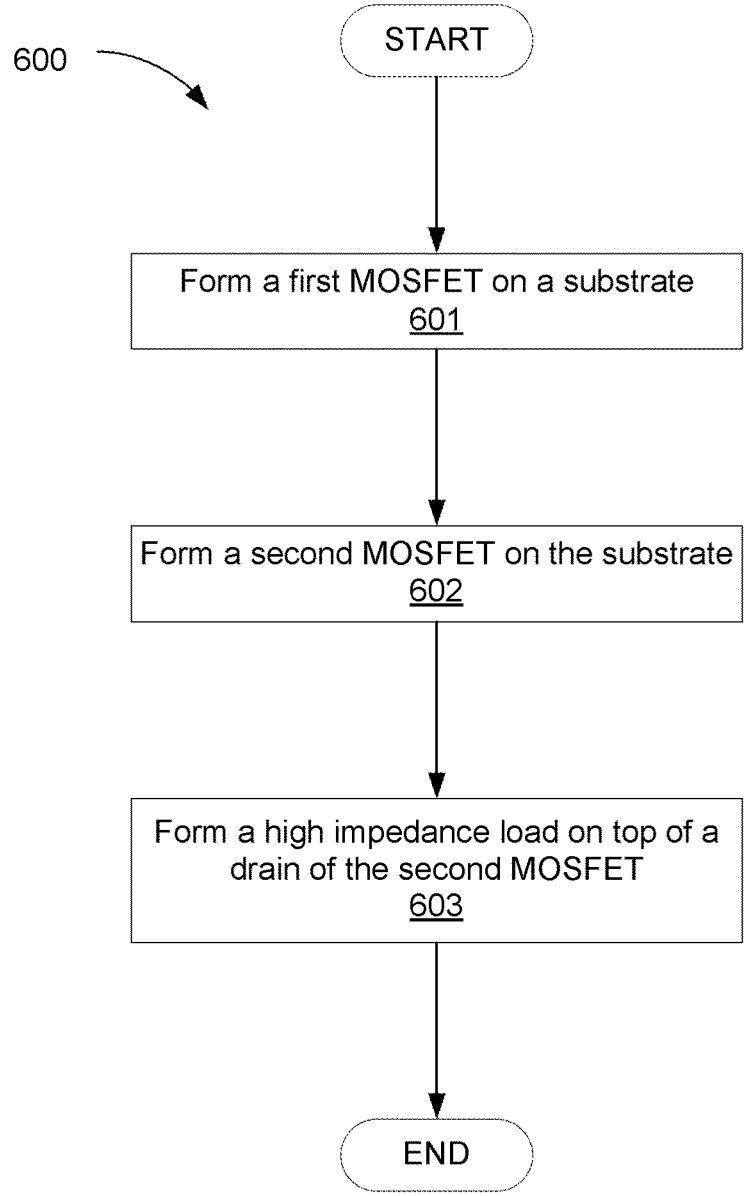
FIG. 6 is a flow chart of a method for forming ratioed logic with a high impedance load according to one example of the principles described herein.

FIG. 6 is a flow chart of a method (600) for forming ratioed logic (FIG. 1, 110) with a high impedance load (FIG. 2, 212) according to one example of the principles described herein. The method (600) includes forming (block 601) a first metal oxide semiconductor field effect transistor (MOSFET) on a substrate. In this method (600), the first MOSFET may form the outside transistor described in connection with FIGS. 4 and 5. As described above, a transistor, such as the first transistor includes a source (FIG. 4, 420-1), a gate (FIG. 4, 421-1), and a drain (FIG. 4, 423-1). Forming (block 601) the first MOSFET may include depositing a first source (FIG. 4, 420-1) and a first drain (FIG. 4, 423-1) on a substrate. For example, an n-type source (FIG. 4, 420-1) and drain (FIG. 4, 423-1) of the first MOSFET may be deposited on a p-type substrate. Forming the source (FIG. 4, 420-1) and drain (FIG. 4, 423-1) may include etching a portion of the p-type substrate to deposit the n-type material to form the source (FIG. 4, 420-1) and the drain (FIG. 4, 423-1).

Forming (block 601) the first MOSFET may also include forming a gate (FIG. 4, 421-1) of the first MOSFET. Forming the gate (FIG. 4, 421-1) may include depositing a layer of a gate oxide material over the source (FIG. 4, 420-1) and drain (FIG. 4, 423-1) and etching away material to form a protrusion between the source (FIG. 4, 420-1) and the drain (FIG. 4, 423-1).

In a similar fashion, a second MOSFET may be formed (block 602) on the substrate. In some examples, the first MOSFET and the second MOSFET may be formed (block 601, 602) simultaneously. For example, the source (FIG. 4, 420-1) and drain (FIG. 4, 423-1) of the first MOSFET may be formed at the same time as the source (FIG. 4, 420-2) and drain (FIG. 4, 423-2) of the second MOSFET. This may include the formation of a combined source/drain (FIG. 4, 422) More specifically, channels for a first source (FIG. 4, 420-1), the combined source/drain (FIG. 4, 422), and a second drain (FIG. 4, 423-2) may be formed in a substrate and material deposited in the channels to form the first source (FIG. 4, 420-1), combined source/drain (FIG. 4, 422), and second drain (FIG. 4, 423-2). In some examples, the source (FIG. 4, 420-2) of the second MOSFET is the drain (FIG. 4, 423-1) of the first MOSFET, i.e., a combined source/drain (FIG. 4, 422). Accordingly, a single channel may be etched in the p-type substrate to deposit the source (FIG. 4, 420-1) of the first MOSFET, the drain (FIG. 4, 423-2) of the second MOSFET, as well as the combined source/drain (FIG. 4, 422) of the first and second MOSFETS. Connections between transistor inputs or outputs allow the implementation of logic functions. For instance connecting two transistor drains (FIG. 4, 423) serves to place those transistors in an OR relationship, as either being closed will allow current to flow through to the drains (FIG. 4, 423). In contrast, connecting the drain (FIG. 4, 423) of one transistor to the source (FIG. 4, 420) of a second transistor places them in an AND relationship as both transistors need to be closed to allow current flow.

Figure 7:
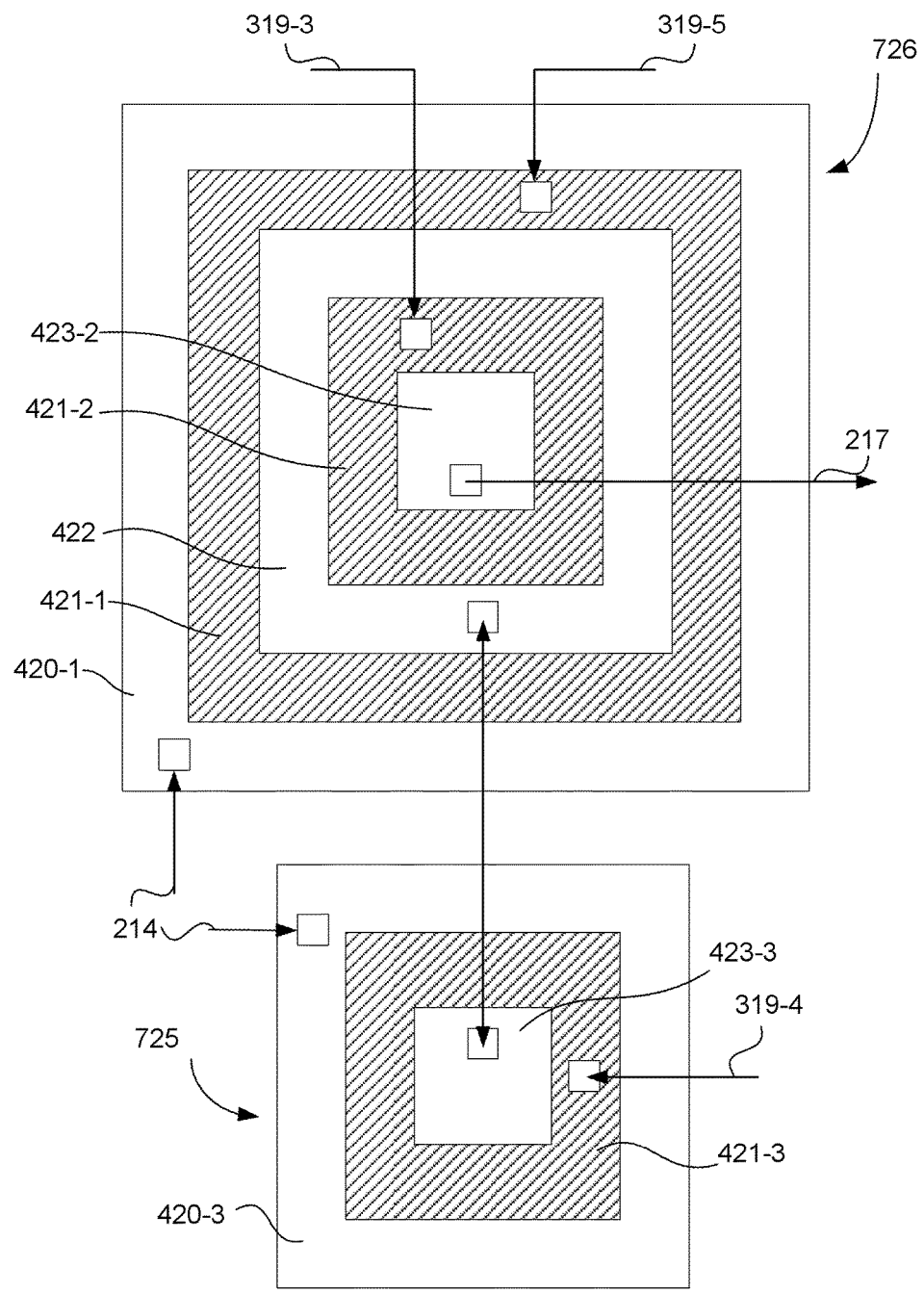
FIG. 7 is a top view of a multiple enclosure ratioed logic with a high impedance load according to another example of the principles described herein.

Similarly, as described above, at least one of the source (FIG. 4, 420-1) of the first MOSFET, the drain (FIG. 4, 423-2) of the second MOSFET, the combined source/drain (FIG. 4, 422), and the gates (FIG. 4, 421) of the MOSFETS may be enclosed elements. Accordingly, forming the first and second MOSFET (block 601, 602) may include forming enclosed shapes of these different elements as depicted in FIGS. 4 and 7. The small size, high impedance loads described will function with all types of transistors, not just enclosed transistors.

The method (600) also includes forming (block 603) a high impedance load (FIG. 2, 212) on top of the drain (FIG.

4, 423-2) of the second MOSFET. More specifically, a drain (FIG. 4, 423-2) may function as an electrode for a memristor (FIG. 3, 316), which is then built on top of the drain (FIG. 4, 423-2). This allows the high impedance load (FIG. 2, 212) to be implemented within the geometry of the transistors without taking up additional space on the substrate. While FIG. 6 depicts a number of operations occurring in a particular order, the operations may be performed in any order or simultaneously.

FIG. 7 is a top view of a multiple enclosure ratioed logic (FIG. 1, 110) with a high impedance load (FIG. 2, 212) according to another example of the principles described herein. More specifically, FIG. 7 shows an example of the circuit in FIG. 3B, according to the principles described herein. FIG. 7 depicts a multiple enclosure transistor (726) with an inside and an outside transistor and a separate, single enclosure transistor (725) that are coupled together to form a logic circuit. Each of the three transistors (inside, outside, and separate) has a source (420-1, 420-3, FIG. 4, 420-2), a gate (421-1, 421-2, 421-3), and a drain (423-2, 423-3, FIG. 4, 423-1). For simplicity in FIG. 7, the drain (FIG. 4, 423-1) of the first transistor and the source (FIG. 4, 420-2) of the second transistors are indicated as the combined source/drain (422). The source (420) of a transistor is where the signal being regulated by the transistor is provided. The drain (423) is where the signal is being output. The gate (421) controls the connection between the source (420) and the drain (423). In these transistors, the source (420) is located on the outside of the gate (421). Similarly, for these transistors, the drain (423) is located on the inside of the gate (421). However, this could be reversed with the source (420) on the inside and the drain (423) on the outside and still function as an equivalent circuit. The sources (420-1, 420-3) for the outside and separate transistors may be coupled to the first voltage (214). The source (FIG. 4, 420-2) of the inside transistor is also the drain (FIG. 4, 423-1) of the outside transistor. The combined source/drain (422) is in electrical contact with the drain (423-3) of the separate transistor (725). Gates (421) receive the inputs (319) and either allow or block the flow of current. Accordingly, the outsider transistor and the separate transistor are in an OR relationship, sharing drains (423-1, 423-3). Similarly, these two transistors form an AND relationship with the inside transistor, since the source (FIG. 4, 420-2) for the inside transistor is coupled to the drain (423-3, FIG. 4, 423-1) for the outside and separate transistors, placing them in series. The drain (423-2) of the inside transistor may be read to provide the output (217) for the logic. In this example, the logic output (217) is the relationship of a first input (319-3) AND (a second input (319-4) OR a third input (319-5)). The described approach allows the implementation of space efficient logics using NMOS transistors and a high impedance load (FIG. 2, 212).

Figure 8:
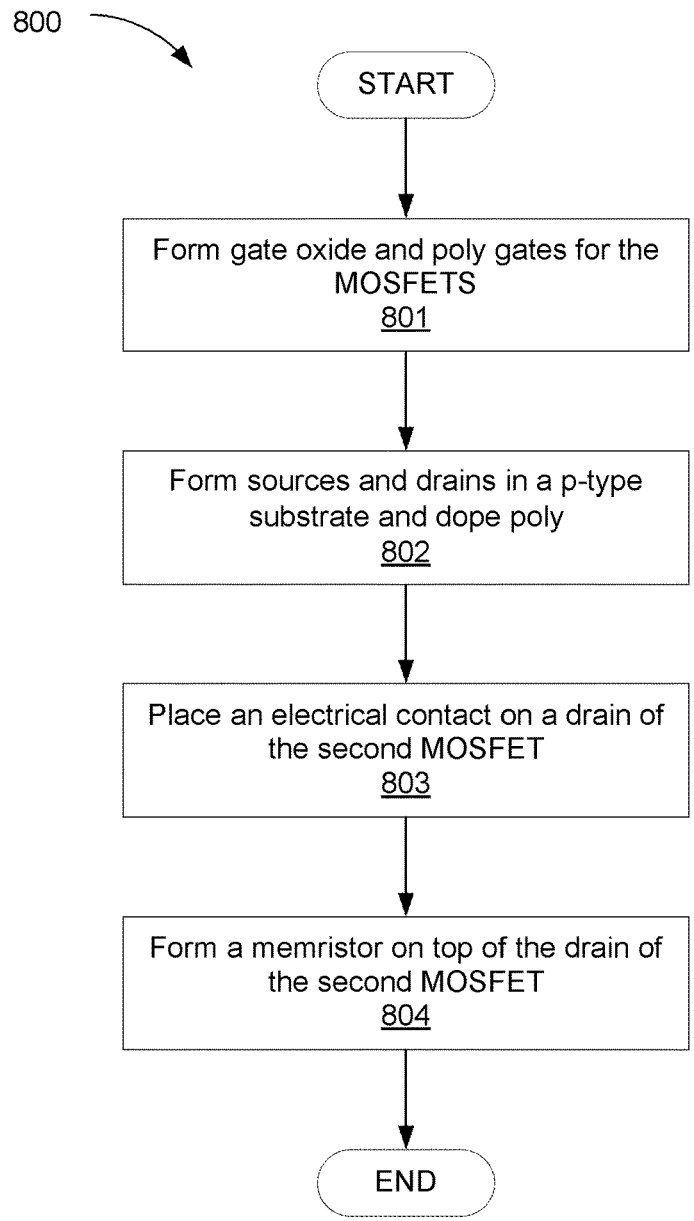
FIG. 8 is a flow chart of a method for forming ratioed logic with a high impedance load according to another example of the principles described herein.

FIG. 8 is a flow chart of a method (800) for forming ratioed logic (FIG. 1, 110) with a high impedance load (FIG. 2, 212) according to another example of the principles described herein. The processes may be performed in a variety of orders to accommodate other design or manufacturing applications. The method includes building a number of transistors, such as metal oxide semiconductor field effect transistors (MOSFETs).

A substrate is provided on which to build the device. The substrate may be silicon and include an oxide surface to insulate the devices build on the substrate. The substrate is used to provide a non-conducting surface that can be etched and doped to provide a conductive substrate.

As part of the method (800), the gate oxides and poly gates (FIG. 4, 421) are formed (block 801). This may include a number of process operations, for instance, etching, deposition, masking, lithography, vapor deposition, ion deposition, etc. The poly gates (FIG. 4, 421) are different in that they may enclose a subsequently formed source or drain. The enclosure geometry may offer improved gate (FIG. 4, 421) performance. The gate oxide serves to insulate the sources (FIG. 4, 420) and drains (FIG. 4, 423) from each other. The gate oxide may be formed of any of a variety of insulating materials to provide this separation. The poly is often located on top of the gate oxide. Poly is used here to indicate the material used to perform this function, which may include polycrystalline silicon, doped polycrystalline silicone, or metal. Accordingly, forming these elements as part of a common series of operations where other portions are masked may have some advantages in process flow.

The method (800) also includes forming (block 802) the sources (FIG. 4, 420) and drains (FIG. 4, 423) using a p-type substrate. The modified substrate increases the conductivity of the silicon substrate, allowing it to pass electrical signals. Forming (block 802) the sources (FIG. 4, 420) and drains (FIG. 4, 423) may include etching, depositing material, photolithography, and/or ion implantation. The poly gates (FIG. 4, 421) are similarly doped to increase conductivity. In some examples, doping the gates (FIG. 4, 421) is performed using ion implantation. This allows the gates (FIG. 4, 421) to induce current flow from a source (FIG. 4, 420) to drain (FIG. 4, 423) when the gate (FIG. 4, 421) is provided with voltage.

Figure 3:
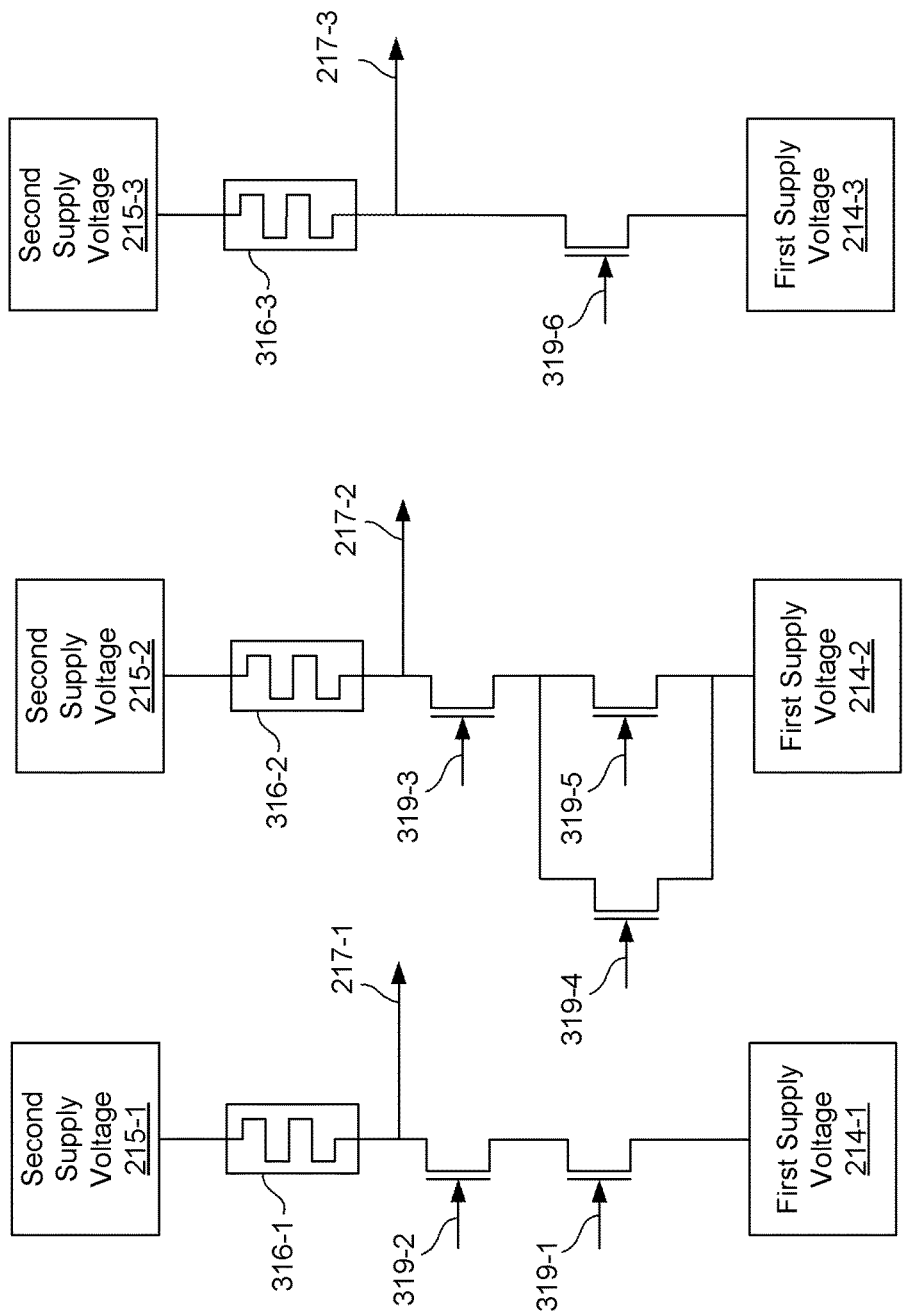
FIG. 3A-3C are circuit diagrams of ratioed logic with a memristor load according to examples of the principles described herein.

The method (800) includes placing (block 803) an electrical connection on a drain (FIG. 4, 423-2) of the inside MOSFET. This electrical connection is the output (FIG. 2, 217) for the ratioed logic (FIG. 1, 110). The output (FIG. 2, 217) is between the pull down network (FIG. 2, 213) and the high impedance load (FIG. 2, 212). If the output (FIG. 2, 217) is on the other side of the high impedance load (FIG. 2, 212), the output (FIG. 2, 217) would read the second voltage (FIG. 2, 215). If the output (FIG. 2, 217) is on the other side of the pull down network (FIG. 2, 213), then it would read the first voltage (FIG. 2, 214). In some processes, the output (FIG. 2, 217) may be formed before the formation of the memristor (FIG. 3, 316); while in other processes the output (FIG. 2, 217) may be formed as part of forming the memristor (FIG. 3, 316) or after the memristor (FIG. 3, 316) is formed. Similarly, forming the output (FIG. 2, 217) may be integrated with other processes. For instance, in one example the output (FIG. 2, 217) is made as part of the drain (FIG. 4, 423) formation. Alternately, block 803 may be included with the connection of the transistors to external signal sources. In another example, the output (FIG. 2, 217) is made during or after the memristor (FIG. 3, 316) is formed, as part of deposition of one of the metal layers of the memristor (FIG. 3, 316).

The method (800) also includes forming (block 804) a memristor (FIG. 3, 316) on top of the drain (FIG. 4, 423-2) of the inside MOSFET. In one example, the drain (FIG. 4, 423-2) acts as part of the memristor (FIG. 3, 316), for instance, the drain (FIG. 4, 423-2) may serve as an electrode. In other examples, the memristor (FIG. 3, 316) is assembled with a separate layer connecting the memristor (FIG. 3, 316) and the drain (FIG. 4, 423-2). Improved tolerance of contact resistance may facilitate processes that use fewer operations or allow higher yields. The other electrode of the memristor (FIG. 3, 316) is connected to the second voltage (FIG. 2, 215). The two electrodes of the memristor (FIG. 3, 316) may be composed of different materials. Some example conductive to semi-conductive materials include: doped silicon, metals, polysilicon, doped polysilicon, conductive polymers, and various semiconductors.

The memristor (FIG. 3, 316) may be a memristor (FIG. 3, 316) set in the high resistance state. The memristor (FIG. 3, 316) may be formed in the high resistance state or it may be set to the high resistance state during or after manufacture. The memristor (FIG. 3, 316) may be a metal-insulator-metal memristor (FIG. 3, 316) where the term metal is used to indicate a conductor, for instance doped silicon. The insulator may be chosen and the thickness determined based on the desired resistance and the insulation value of the insulator. The overall thickness of the insulator and its resistance are determined, in part, by the desired response performance of the system, the amount of current consumption tolerated, the fan-out of the logic output including what is being controlled or driven by the logic, the ease of integrating the materials into production, and the number of additional processes it adds to wafer fabrication. Accordingly these elements are varied to optimize the particular design.

Because memristors (FIG. 3, 316) add significant other benefits to devices, including potentially high memory densities, simple formation, non-volatile memory, and low costs, using a memristor (FIG. 3, 316) or a high impedance load (FIG. 2, 212) made with memristor (FIG. 3, 316) components may be incorporated into some designs without additional process operations or production costs. The compact design of the memristor (FIG. 3, 316) being built into the footprint of the transistor offers the advantage of a high impedance load (FIG. 2, 212) without occupying additional space.

In some examples, it may be possible to further simplify the memristor (FIG. 3, 316) functioning as a high impedance load (FIG. 2, 212). For instance, some control elements that would otherwise be desired to set or clear the memristor (FIG. 3, 316) memory may not be included. Because the memristor (FIG. 3, 316) does not serve as a low resistance element, the electrical contacts can be relatively poor conductors and still perform their function.

The source (FIG. 4, 420-1) for the outside transistor is connected to the first voltage (FIG. 2, 214) either directly or through other elements, possibly including other logic elements. The two voltages (FIG. 2, 214, 215) provide the two states that will be read off the output (FIG. 2, 217). One of the two may be a ground. Voltages (FIG. 2, 214, 215) may be selected depending on other system characteristics so long as they provide sufficient power to operate the transistors and the signals can be adequately differentiated. The voltages may be arbitrarily assigned to logic values depending on design choices.

A device using a high impedance load (FIG. 2, 212) with multi-enclosed transistors to allow functioning of a ratioed pull down logic may have a number of advantages, including: reduced manufacturing costs, fewer process operations, the ability to vary the high impedance load (FIG. 2, 212) from area to area of the circuit, smaller geometries for the logic, and shorter connection distances between elements.

The preceding description has been presented to illustrate and describe examples of the principles described. This description is not intended to be exhaustive or to limit these principles to any precise form disclosed. Many modifications and variations are possible in light of the above teaching.

What is claimed is:

1. A system comprising:
a first voltage;
a second voltage;
an output;
a substrate;
a number of n-channel metal-oxide-semiconductor (NMOS) field effect transistors supported by the substrate and serially-coupled between the first voltage and the output; and
a high impedance load supported by the substrate and serially-coupled between the second voltage and the output,
wherein a first NMOS field effect transistor of the number of NMOS field effect transistors comprises a drain disposed in the substrate, and the high impedance load has an electrode layer disposed on top of the drain of the first NMOS field effect transistor and over the substrate.

2. The system of claim 1, wherein the number of NMOS field effect transistors include a number of double enclosed NMOS field effect transistors, where a drain of one of the double enclosed NMOS field effect transistors functions as a source of another of the double enclosed NMOS field effect transistors.

3. The system of claim 1, wherein the high impedance load is a memristor that is non-rewriteable.

4. The system of claim 1, wherein the first voltage is ground.

5. A method for forming ratioed logic with a high impedance load, comprising:
forming a first metal-oxide-semiconductor field-effect transistor (MOSFET) on a substrate;
forming a second MOSFET on the substrate; and
forming the high impedance load on top of a drain of the second MOSFET,
wherein:
a source of the second MOSFET and a drain of the first MOSFET are shared;
the drain of the first MOSFET is enclosed by a source of the first MOSFET; and
the drain of the second MOSFET is enclosed by the source of the second MOSFET.

6. The method of claim 5, wherein the high impedance load is a memristor.

7. The method of claim 6, wherein the memristor is a non-rewriteable memristor.

8. The method of claim 5, further comprising:
depositing a number of n-type channels in a p-type substrate, wherein the n-type channels correspond to the source and the drain of the first MOSFET and the source and the drain of the second MOSFET; and
forming a first gate of the first MOSFET and a second gate of the second MOSFET.

9. The method of claim 5, wherein the drain of the second MOSFET is disposed in the substrate, and the high impedance load comprises an electrode layer formed on the drain and over the substrate.

10. A device having ratioed logic, comprising:
an output;
a pull-down network comprising a number of n-channel metal-oxide-semiconductor (NMOS) field-effect transistors serially-coupled between a first voltage and the output;
a high impedance load serially-coupled between a second voltage and the output; and
a substrate, a first NMOS field effect transistor of the number of NMOS field effect transistors comprises a drain disposed in the substrate, and the high impedance load comprises an electrode layer formed on the drain and over the substrate, and wherein a gate of the first NMOS field effect transistor is enclosed by a source of the first NMOS field effect transistor.

11. The device of claim 10, wherein the high impedance load comprises a memristor in a high resistance state.

12. The device of claim 11, wherein the memristor is non-rewriteable.

13. The device of claim 10, wherein the pull-down network and the high impedance load are disposed on a printhead.

14. The device of claim 10, wherein the electrode layer of the high impedance load is enclosed by the gate of the first NMOS field effect transistor.

15. The device of claim 14, wherein the drain of the first NMOS field effect transistor is enclosed by the gate of the first NMOS field effect transistor.

16. The device of claim 14, wherein the source of the first NMOS field effect transistor is enclosed by a gate of a second NMOS field effect transistor of the number of NMOS field effect transistors.

17. A device having ratioed logic, comprising:
an output;
a pull-down network comprising a transistor serially-coupled between a first voltage and the output;
a high impedance load serially-coupled between a second voltage and the output; and
a substrate, the transistor comprising a drain disposed in the substrate, and the high impedance load comprising a first electrode layer formed on the drain and over the substrate, wherein the high impedance load comprises a memory element including the first electrode layer, a second electrode layer, and an insulator layer between the first and second electrode layers.

18. The device of claim 17, wherein the pull-down network comprises a number of n-channel metal-oxide-semiconductor (NMOS) field-effect transistors.

19. The device of claim 18, wherein the number of NMOS field effect transistors are formed as a multi-enclosed transistor.

* * * * *